US012751280B2

(12) United States Patent
Ko et al.

(10) Patent No.: US 12,751,280 B2
(45) Date of Patent: Sep. 29, 2026

(54) SEMICONDUCTOR PACKAGE WITH A CARBONIZED MODIFIED LAYER COVERED BY A PASSIVATION LAYER

(71) Applicant: SAMSUNG ELECTRONICS CO., LTD., Suwon-si (KR)

(72) Inventors: Yeongkwon Ko, Suwon-si (KR); Jiyoung Park, Suwon-si (KR); Hosin Song, Suwon-si (KR); Sera Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 356 days.

(21) Appl. No.: 18/612,137

(22) Filed: Mar. 21, 2024

(65) Prior Publication Data

US 2024/0321744 A1 Sep. 26, 2024

(30) Foreign Application Priority Data

Mar. 24, 2023 (KR) ........................ 10-2023-0038953
Mar. 30, 2023 (KR) ........................ 10-2023-0042248

(51) Int. Cl.
*H10W 20/41* (2026.01)
*H10W 20/20* (2026.01)
(Continued)

(52) U.S. Cl.
CPC ......... *H10W 20/435* (2026.01); *H10W 20/20* (2026.01); *H10W 20/48* (2026.01); *H10W 70/095* (2026.01); *H10W 72/30* (2026.01); *H10W 72/851* (2026.01); *H10W 72/90* (2026.01); *H10W 90/00* (2026.01); *H10W 90/297* (2026.01); *H10W 90/724* (2026.01);
(Continued)

(58) Field of Classification Search
CPC . H10W 20/076; H10W 20/435; H10W 20/20; H10W 20/48; H10W 20/081; H10W 72/851; H10W 72/90; H10W 72/30; H10W 90/00; H10W 90/732; H10W 90/297; H10W 90/724; H10W 90/722; H10W 70/095
See application file for complete search history.

(56) References Cited

U.S. PATENT DOCUMENTS 7,067,922 B2 6/2006 Hasunuma et al.
7,294,937 B2 11/2007 Su et al.
(Continued)

FOREIGN PATENT DOCUMENTS

JP 2004-296905 10/2004
JP 2021-168335 10/2021
KR 10-0641364 10/2006

*Primary Examiner* — Alonzo Chambliss
(74) *Attorney, Agent, or Firm* — Fish & Richardson P.C.

(57) ABSTRACT

The present disclosure relates to semiconductor packages. An example semiconductor package includes a substrate including an active surface and an inactive surface, a plurality of wiring structures arranged on the active surface of the substrate, an inter-wiring insulating layer arranged on the active surface of the substrate and configured to cover the plurality of wiring structures, a modified layer including both side surfaces thereof covered by the inter-wiring insulating layer and including a carbonized material, and a passivation layer arranged on the inter-wiring insulating layer and the modified layer.

20 Claims, 16 Drawing Sheets

(51) Int. Cl.

| | |
|---|---|
| ***H10W 20/40*** | (2026.01) |
| ***H10W 20/48*** | (2026.01) |
| ***H10W 70/05*** | (2026.01) |
| ***H10W 72/00*** | (2026.01) |
| ***H10W 72/30*** | (2026.01) |
| ***H10W 72/90*** | (2026.01) |
| ***H10W 74/15*** | (2026.01) |
| ***H10W 90/00*** | (2026.01) |
| ***H10W 90/20*** | (2026.01) |

(52) U.S. Cl.
CPC .......... *H10W 74/15* (2026.01); *H10W 90/722* (2026.01); *H10W 90/732* (2026.01)

(56) References Cited

U.S. PATENT DOCUMENTS

| | | | | |
|---|---|---|---|---|
| 7,358,155 | B2 | 4/2008 | Ahn et al. | |
| 7,977,213 | B1 | 7/2011 | Hooper et al. | |
| 8,642,448 | B2 | 2/2014 | Lei et al. | |
| 10,910,270 | B2 | 2/2021 | Choi et al. | |
| 11,721,604 | B2 * | 8/2023 | Choi ..................... | H10W 40/22 257/737 |
| 2005/0136622 | A1 | 6/2005 | Mulligan et al. | |
| 2021/0336401 | A1 | 10/2021 | Kwon et al. | |
| 2024/0178191 | A1 * | 5/2024 | Jung ..................... | H10W 90/00 |

* cited by examiner

SEMICONDUCTOR PACKAGE WITH A CARBONIZED MODIFIED LAYER COVERED BY A PASSIVATION LAYER

CROSS-REFERENCE TO RELATED APPLICATIONS

This application claims priority to Korean Patent Application Nos. 10-2023-0038953, filed on Mar. 24, 2023, and 10-2023-0042248, filed on Mar. 30, 2023, in the Korean Intellectual Property office, the disclosures of which are incorporated by reference herein in their entirety.

BACKGROUND

The present disclosure relates to a semiconductor package and a method of manufacturing the semiconductor package, and more particularly, to a semiconductor package including a plurality of semiconductor chips, which are vertically stacked, and a method of manufacturing the semiconductor package.

According to the rapid development of the electronics industry and user demand, semiconductor packages mounted on electronic products are required to provide high performance and include various functions, and thus, the semiconductor packages including a plurality of semiconductor chips have been proposed. In addition, semiconductor packages including a plurality of semiconductor chips, which are vertically stacked, are being developed to reduce the sizes of semiconductor packages including the plurality of semiconductor chips.

SUMMARY

The present disclosure relates to a semiconductor package including a plurality of semiconductor chips, which are vertically stacked, capable of implementing miniaturization and high performance.

In some aspects, a semiconductor package includes a substrate including an active surface and an inactive surface, a plurality of wiring structures arranged on the active surface of the substrate, an inter-wiring insulating layer arranged on the active surface of the substrate and covering the plurality of wiring structures, a modified layer including both side surfaces thereof covered by the inter-wiring insulating layer and including a carbonized material, and a passivation layer arranged on the inter-wiring insulating layer and the modified layer.

In other aspects, a semiconductor package includes a substrate including an active surface and an inactive surface, a plurality of wiring structures arranged on the active surface of the substrate, an inter-wiring insulating layer arranged on the active surface of the substrate, and covering the plurality of wiring structures, and including a main region and an edge region surrounding the main region in a plan view, a modified layer arranged between the main region and the edge region of the inter-wiring insulating layer, and including a carbonized material of a material constituting the inter-wiring insulating layer, and a passivation layer arranged on the inter-wiring insulating layer and the modified layer, wherein the passivation layer includes a first portion on the modified layer and a second portion on the main region of the inter-wiring insulating layer, and a bottom surface of the first portion of the passivation layer is on an identical level to a bottom surface of the second portion of the passivation layer.

In other aspects, a semiconductor package includes a buffer die including a first semiconductor substrate including a first active surface and a first inactive surface opposite to each other, a plurality of first through electrodes penetrating the first semiconductor substrate, a first inter-wiring insulating layer on the first active surface of the first semiconductor substrate, a first front surface insulating layer on the first inter-wiring insulating layer, and a first rear surface insulating layer on the first inactive surface of the first semiconductor substrate, a plurality of memory dies sequentially stacked on the buffer die, each memory die including a second semiconductor substrate including a second active surface and a second inactive surface opposite to each other, a plurality of second through electrodes penetrating the second semiconductor substrate, a second inter-wiring insulating layer on the second active surface, a second front surface insulating layer on the second inter-wiring insulating layer, and a second rear surface insulating layer on the second inactive surface, wherein the second active surface is toward the first inactive surface of the buffer die, a plurality of first bonding pads arranged between a lowermost memory die of the plurality of memory dies and the buffer die, and surrounded by the second front surface insulating layer of the lowermost memory die and the first rear surface insulating layer, and a plurality of second bonding pads arranged between two adjacent memory dies of the plurality of memory dies, and surrounded by the second front surface insulating layer and the second rear surface insulating layer arranged between two adjacent memory dies of the plurality of memory dies, wherein the first inter-wiring insulating layer includes a first region arranged on the chip region of the buffer die and a second region arranged on a scribe lane region of the buffer die, and the first region and the second region are apart from each other by a modified layer arranged therebetween.

In other aspects, a method of manufacturing a semiconductor package includes providing a substrate including an active surface and an inactive surface opposite to the active surface, a chip region and a scribe lane region surrounding the chip region in a plan view, and a device layer on the active surface and the chip region, forming, on the active surface of the substrate, a plurality of wiring structures electrically connected to the device layer and an inter-wiring insulating layer configured to cover the plurality of wiring structures, forming, on the inter-wiring insulating layer, a passivation layer configured to cover respectively the plurality of wiring structures, and forming a modified layer from a portion of the inter-wiring insulating layer arranged on the scribe lane region by using laser light, wherein the laser light has a transmittance equal to or greater than 90% with respect to a first portion of the passivation layer arranged on the portion of the inter-wiring insulating layer.

BRIEF DESCRIPTION OF THE DRAWINGS

The above and other aspects, features, and advantages of the present disclosure will be more clearly understood from the following detailed description, taken in conjunction with the accompanying drawings.

DETAILED DESCRIPTION

Hereinafter, example implementations are described in detail in conjunction with the accompanying drawings.

Figure 1:
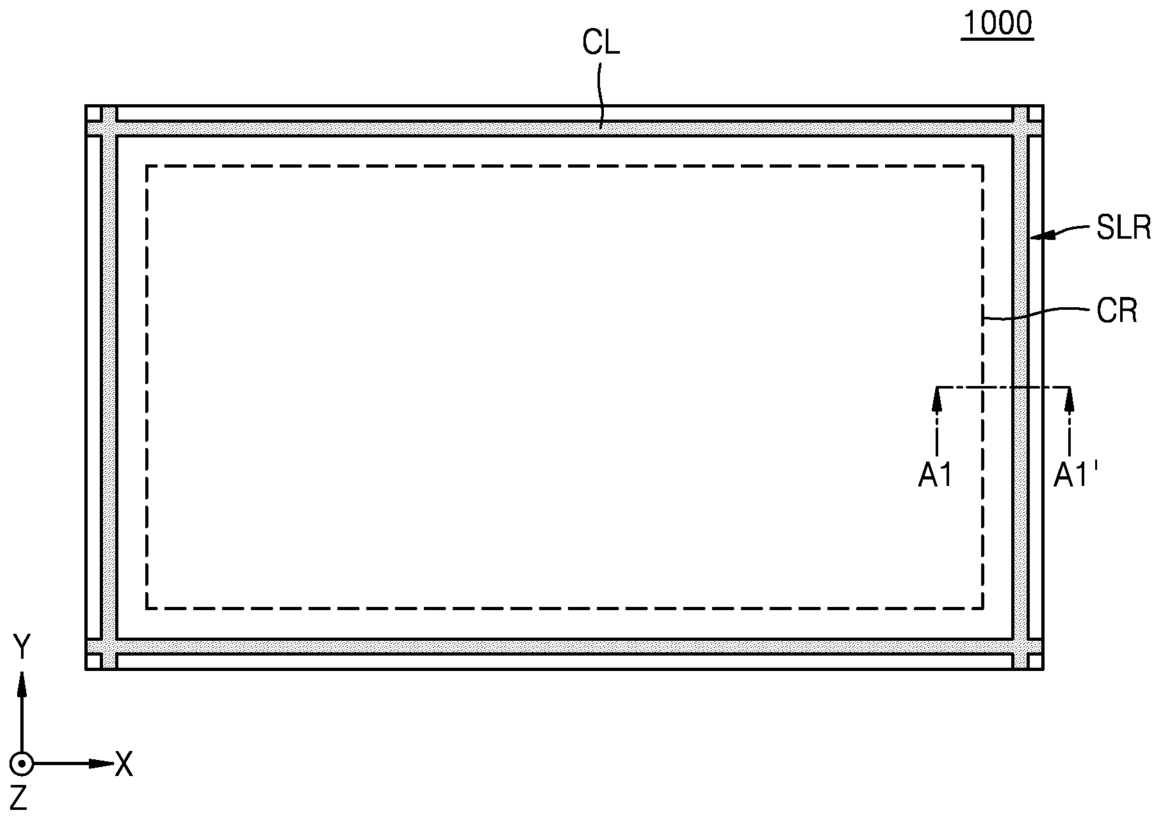
FIG. 1 is a plan view of an example of a semiconductor package.
Figure 2:
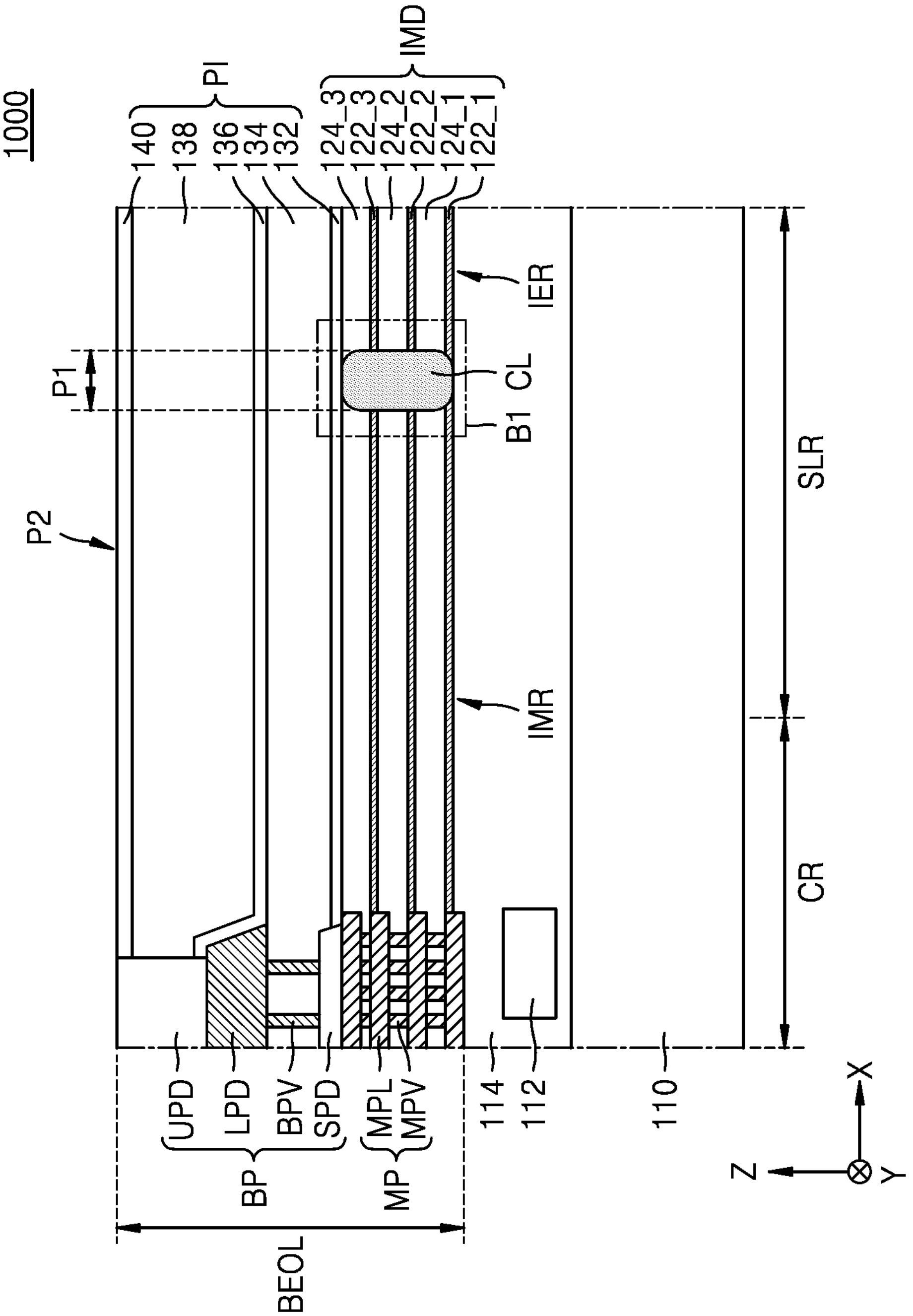
FIG. 2 is an example cross-sectional view of a region A1-A1' in FIG. 1.
Figure 3:
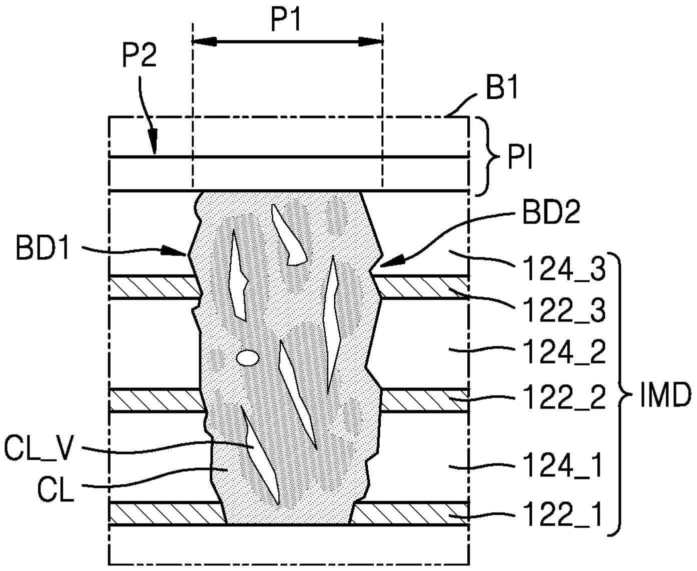
FIGS. 3 through 5 are example enlarged diagrams of a region B1 in FIG. 2.
Figure 4:
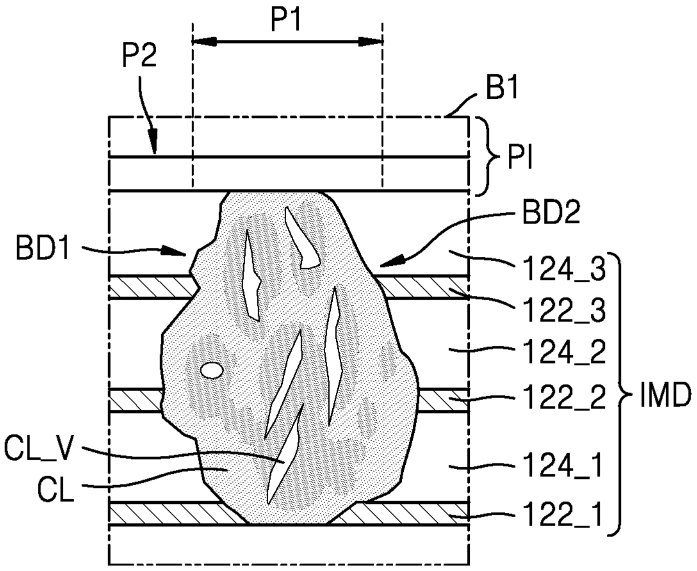
Figure 5:
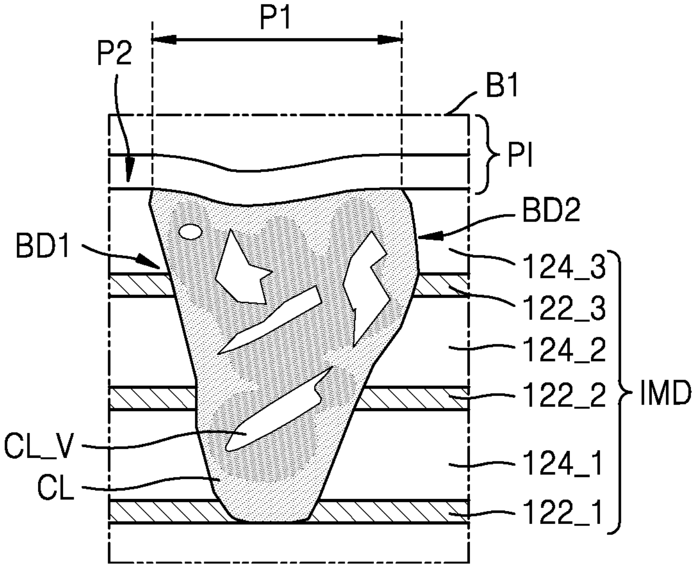

FIG. 1 is a plan view of an example of a semiconductor package 1000. FIG. 2 is an example cross-sectional view of a region A1-A1' in FIG. 1. FIGS. 3 through 5 are example enlarged diagrams of a region B1 in FIG. 2.

Referring to FIGS. 1 through 3, the semiconductor package 1000 may include a semiconductor chip, and the semiconductor chip may include a substrate 110 including a chip region (CR) and a scribe lane region (SLR), a device layer 112 provided on the substrate 110, an interlayer insulating layer 114 covering the device layer 112, and a back end of line (BEOL) structure arranged on the interlayer insulating layer 114.

In some implementations, the semiconductor chip may include, for example, a central processing unit (CPU) chip, a graphics processing unit (GPU) chip, or an application processor (AP) chip. The semiconductor chip may include, for example, a dynamic random access memory (RAM) (DRAM) chip, a static RAM (SRAM) chip, a flash memory chip, an electrically erasable and programmable read-only memory (ROM) (EEPROM) chip, a phase-change RAM (PRAM) chip, a magnetic RAM (MRAM) chip, or a resistive RAM (RRAM) chip.

The substrate 110 may include silicon (Si). Alternatively, the substrate 110 may include a semiconductor element such as germanium (Ge), or a compound semiconductor, such as silicon carbide (SiC), gallium arsenide (GaAs), indium arsenide (InAs), and indium phosphide (InP). The substrate 110 may include an active surface and an inactive surface opposite to the active surface.

The device layer 112 including various types of individual devices may be formed on the active surface of the substrate 110. The device layer 112 may include various microelectronic devices, for example, a metal-oxide-semiconductor field effect transistor (MOSFET) such as a complementary metal-insulator-semiconductor (CMOS) transistor, an image sensor, such as a system large scale integration (LSI) (SLSI) sensor, and a CMOS imaging sensor (CIS), a micro-electro-mechanical system (MEMS), an active device, a passive device, etc.

The device layer 112 may be arranged on the CR of the substrate 110. In a plan view, the CR may be arranged in the center portion of the semiconductor chip, and the SLR may be arranged to surround the CR around an edge of the CR. The SLR may include a portion of the scribe lanes formed on a semiconductor substrate, such as a wafer, which remains on an individualized semiconductor chip, and may be arranged along the edge of the semiconductor chip to surround the CR.

The interlayer insulating layer 114 may be arranged to cover the device layer 112 on the active surface of the substrate 110. A plurality of conductive wirings or conductive plugs electrically connected to the device layer 112 and/or the substrate 110 may be further arranged in the interlayer insulating layer 114. The plurality of conductive wirings or conductive plugs arranged inside the device layer 112, the interlayer insulating layer 114, and the interlayer insulating layer 114 may be referred to as a front end of line (FEOL) structure.

Although not illustrated, a plurality of through electrodes penetrating at least a portion of the substrate 110 and the interlayer insulating layer 114 may be further arranged, and the plurality of through electrodes may be electrically connected to the device layer 112 via the conductive wirings and conductive plugs.

The BEOL structure may include a wiring structure MP, an inter-wiring insulating layer IMD covering the wiring structure MP, a modified layer CL arranged in the inter-wiring insulating layer IMD, a passivation layer PI arranged on the inter-wiring insulating layer IMD, and a bonding pad structure BP.

The wiring structure MP may include a plurality of wiring layers MPL, and a plurality of via plugs MPV respectively connected to the plurality of wiring layers MPL. The wiring structure MP may be electrically connected to the device layer 112 and/or the plurality of through electrodes. The plurality of wiring layers MPL may have a multi-layer wiring structure including the wiring layers MPL at different levels. The plurality of via plugs MPV may extend from bottom surfaces of the wiring layers MPL, which has a multi-layer wiring structure at different levels, toward the substrate 110. Some of the plurality of via plugs MPV may connect between the wiring layers MPL at different levels, and the other via plugs MPV may connect between some of the wiring layers MPL and the device layer 112.

The inter-wiring insulating layer IMD may be arranged on the interlayer insulating layer 114 to cover at least a portion of the wiring structure MP. For example, the inter-wiring insulating layer IMD may be arranged to surround sidewalls of the wiring structure MP and may be arranged to include an upper surface thereof arranged at the same level as the upper surface of the wiring structure MP. At least a portion of the inter-wiring insulating layer IMD may include a low dielectric constant dielectric material, that is, a material having a dielectric constant that is less than that of silicon oxide.

In some implementations, as illustrated in FIG. 2, the inter-wiring insulating layer IMD may include a first etch stop layer 122_1, a first low-k dielectric material layer 124_1, a second etch stop layer 122_2, a second low-k dielectric material layer 124_2, a third etch stop layer 122_3, and a third low-k dielectric material layer 124_3. For example, the first through third low-k dielectric material layers 124_1, 124_2, and 124_3 may include at least one of silicon carbon oxide (SiOC), silicon carbon nitride (SiCN), porous silicon carbide (SiC), and SiC hydroxide (SiCOH). The first through third etch stop layers 122_1, 122_2, and 122_3 may include at least one of SiOC, SiCN, SiC, and SiCOH and may respectively include materials having etching selectivities with respect to the first through third low-k dielectric material layers 124_1, 124_2, and 124_3.

In some implementations, as illustrated in FIG. 2, an upper surface of each of the first through third etch stop layers 122_1, 122_2, and 122_3 may be arranged on the same surface as the upper surface of each of the plurality of wiring layers MPL of the wiring structure MP, but the implementation is not limited thereto. In some implementations, as illustrated in FIG. 2, each of the first through third low-k dielectric material layers 124_1, 124_2, and 24_3 may have a relatively flat upper level.

In some implementations, the inter-wiring insulating layer IMD may include a main region IMR and an edge region IER, and in a plan view, the main region IMR may be arranged to extend onto at least a portion of the SLR on the CR of the substrate 110. The edge region IER may be arranged on the SLR of the substrate 110, and may be arranged apart from the main region IMR in a lateral direction or horizontally.

In some implementations, the modified layer CL may be arranged within the inter-wiring insulating layer IMD, or between the main region IMR and the edge region IER of the inter-wiring insulating layer IMD. As illustrated in FIG. 1, the modified layer CL may extend along the edge boundary of the substrate 110 on the SLR, and may have a horizontal cross-section of, for example, a rectangular shape.

In some implementations, the modified layer CL may include a material that is formed by carbonization or phase-change of a material constituting the inter-wiring insulating layer IMD. For example, the modified layer CL may include a carbonized material formed by a carbonization process of a low-k dielectric material. In some implementations, the modified layer CL may be referred to as a region, where a material constituting the inter-wiring insulating layer IMD (for example, a material constituting at least one of the first through third low-k dielectric material layers 124_1, 124_2, and 124_3 and the first through third etch stop layers 122_1, 122_2, and 122_3) is carbonized due to heat, which is locally generated by irradiation of laser light, and remains, and the modified layer CL may include a resultant product, that is, a material constituting the inter-wiring insulating layer IMD that has been carbonized by heat, for example, a carbonized material.

For example, in some implementations, as illustrated in FIG. 3, a void CL_V may be arranged inside the modified layer CL. The void CL_V may be generated as water vapor or gas, which is generated when a material constituting the inter-wiring insulating layer IMD is carbonized by heat, which is locally generated by irradiation of the laser light, remains in the carbonized area.

In some implementations, the modified layer CL may include an upper surface arranged on the same surface as the upper surface of the inter-wiring insulating layer IMD, and a bottom surface arranged on the same surface as the bottom surface of the inter-wiring insulating layer IMD. In some implementations, the modified layer CL may include a first side surface and a second side surface and the first and second side surfaces may be covered by the inter-wiring insulating layer IMD. For example, a boundary BD1 between the modified layer CL and the main region IMR of the inter-wiring insulating layer IMD may face a boundary BD2 between the modified layer CL and the edge region IER of the inter-wiring insulating layer IMD.

In some implementations, as illustrated in FIG. 3, at least a portion of the boundary BD1 between the modified layer CL and the main region IMR of the inter-wiring insulating layer IMD may have an irregular, rough, and unsmooth shape and at least a portion of the boundary BD2 between the modified layer CL and the edge region IER of the inter-wiring insulating layer IMD may have an irregular, rough, and unsmooth shape. In addition, the modified layer CL may have a difference in composition of a localized carbonized material inside the modified layer CL. For example, some region of the modified layer CL may have relatively higher carbon content due to heat locally generated by the irradiation of the laser light and the other region of the modified layer CL may have relatively lower carbon content. In addition, the void CL_V may be formed in some region of the modified layer CL. In some implementations, it may be observed that some region of the modified layer CL has a black or gray color due to the carbonized material. In some implementations, as illustrated in FIG. 3, the modified layer CL may be formed to have a relatively uniform width over the total height of the modified layer CL. In some examples, the width of the modified layer CL may range from about 2 micrometers to about 30 micrometers.

In some other implementations, as illustrated in FIG. 4, the modified layer CL may also be formed to have a greater width at the center of the modified layer CL than at the upper and lower sides of the modified layer CL. For example, the horizontal width of a portion of the modified layer CL surrounded by the second low-k dielectric material layer 124_2 and/or the horizontal width of a portion of the modified layer CL surrounded by the first low-k dielectric material layer 124_1 may be formed to be greater than the horizontal width of a portion of the modified layer CL surrounded by the third low-k dielectric material layer 124_3. The sidewall of the modified layer CL may protrude more outward from the central portion of the modified layer CL than from the upper and lower sides of the modified layer CL.

In some other implementations, as illustrated in FIG. 5, the modified layer CL may also be formed to have a greater width at the upper side of the modified layer CL than at the lower side of the modified layer CL. For example, the horizontal width of a portion of the modified layer CL surrounded by the third low-k dielectric material layer 124_3 and/or the horizontal width of a portion of the modified layer CL surrounded by the first low-k dielectric material layer 124_1 may be formed to be greater than the horizontal width of a portion of the modified layer CL surrounded by the second low-k dielectric material layer 124_2.

The bonding pad structure BP may be arranged on the inter-wiring insulating layer IMD. The bonding pad structure BP may include a sub-pad SPD arranged on the wiring structure MP, a pad via BPV connected to the sub-pad SPD, a lower pad LPD electrically connected to the pad via BPV, and an upper pad UPD arranged on the lower pad LPD.

In some implementations, the sub-pad SPD and the pad via BPV may include a barrier layer and a metal layer. The barrier layer may include nitride or oxide of a metal, such as titanium (Ti), tantalum (Ta), ruthenium (Ru), manganese (Mn), copper (Co), and tungsten (W, or an alloy, such as CoWP, CoWB, and CoWBP. The metal layer may include at least one metal of W, Al, Ti, Ta, Ru, Mn, and Cu. The lower pad LPD and the upper pad UPD may include a barrier layer and a metal layer. The barrier layer may include a nitride or an oxide of a metal, such as Ti, Ta, Ru, Mn, Co, and W, or an alloy, such as CoWP, CoWB, and CoWBP. The metal layer may include at least one metal of W, Al, Ti, Ta, Ru, Mn, and Cu. In some implementations, the upper pad UPD may include Cu.

The passivation layer PI surrounding the bonding pad structure BP may be arranged on the inter-wiring insulating layer IMD and the modified layer CL. The passivation layer PI may include a first insulating layer 132, a second insulating layer 134, a third insulating layer 136, a fourth insulating layer 138, and a cover insulating layer 140, which are sequentially stacked on the inter-wiring insulating layer IMD and the modified layer CL.

In some implementations, the first insulating layer 132, the second insulating layer 134, the third insulating layer 136, the fourth insulating layer 138, and the cover insulating layer 140 may include at least one of silicon oxide, silicon oxynitride, and silicon nitride. In some implementations, the second insulating layer 134, the fourth insulating layer 138, and the cover insulating layer 140 may include a material having an etching selectivity with respect to the first insulating layer 132 and the third insulating layer 136.

In some implementations, the first insulating layer 132 may be arranged on the upper surface of the inter-wiring insulating layer IMD and the upper surface of the modified layer CL and may have a substantially flat bottom surface level. The first insulating layer 132 may surround a portion of the sidewall of the sub-pad SPD, and the second insulating layer 134 may be formed at a relatively large height on the first insulating layer 132 so that the sub-pad SPD surrounds the upper surface and the sidewall of the second insulating layer 134. The pad via BPV may penetrate the second insulating layer 134 to extend in a vertical direction Z and may be arranged to contact the upper surface of the sub-pad SPD. The lower pad LPD may be electrically connected to the pad via BPV on the second insulating layer 134, and the third insulating layer 136 may extend onto the upper surface and sidewall of the lower pad LPD on the second insulating layer 134. The fourth insulating layer 138 may be arranged on the third insulating layer 136 to surround the sidewall of the upper pad UPD, and the cover insulating layer 140 may be arranged on the fourth insulating layer 138 to have an upper surface arranged at the same level as the upper surface of the upper pad UPD.

In some implementations, the cover insulating layer 140 and the upper pad UPD may include upper surfaces arranged on the same surface, and accordingly, the cover insulating layer 140 and the upper pad UPD may be used to attach a semiconductor chip to another semiconductor chip by using a hybrid copper bonding method, but the implementation is not limited thereto.

For example, the passivation layer PI may include a first portion P1 arranged on the upper surface of the inter-wiring insulating layer IMD and a second portion P2 arranged on the upper surface of the modified layer CL, and as illustrated in FIGS. 2 through 4, a bottom surface of the first portion P1 (for example, a bottom surface of a portion of the first insulating layer 132 corresponding to the first portion P1) may be arranged on the same plan surface as a bottom surface of the second portion P2 (for example, a bottom surface of a portion of the first insulating layer 132 corresponding to the second portion P2). In some other implementations, as illustrated in FIG. 5, the volume of the modified layer CL may be locally reduced according to the degree of carbonization inside the modified layer CL or the degree of formation of the void CL_V, and accordingly, the bottom surface of the first portion P1 of the passivation layer PI (for example, the bottom surface of a portion of the first insulating layer 132 corresponding to the first portion P1) may be arranged at a somewhat lower level than the bottom surface of the second portion P2 (for example, the bottom surface of a portion of the first insulating layer 132 corresponding to the second portion P2).

In some implementations, the passivation layer PI may include a material having a higher dielectric constant than a material constituting the inter-wiring insulating layer IMD. In addition, the passivation layer PI (or the first portion P1 of the passivation layer PI) may include a material having a relatively high transmittance to laser light. For example, the inter-wiring insulating layer IMD may have a first transmittance with respect to laser light and the passivation layer PI may have a second transmittance that is higher than the first transmittance with respect to laser light. In some implementations, the passivation layer PI may have a second transmittance of 90% or more with respect to the laser light in a range of about 400 nm to 1080 nm. As the passivation layer PI has a relatively high second transmittance with respect to laser light, even when a portion of the inter-wiring insulating layer IMD is converted into the modified layer CL as the laser light is irradiated on the first portion P1 of the passivation layer PI, there may be little or no physical change in the first portion P1 of the passivation layer PI irradiated with the laser light.

In some implementations described above, the modified layer CL may be formed by irradiating the laser light on the passivation layer PI in a state, where the passivation layer PI is formed on the inter-wiring insulating layer IMD, and carbonizing or phase-changing a portion of the inter-wiring insulating layer IMD into the modified layer CL, and the main region IMR and the edge region IER of the inter-wiring insulating layer IMD may be physically separated and apart from each other due to formation of the modified layer CL. Thus, even when the edge region IER of the inter-wiring insulating layer IMD is exposed by laser sawing or blade sawing in the process of sawing and individualizing wafers into the semiconductor package 1000, the main region IMR of the inter-wiring insulating layer IMD may be prevented from being peeled off and accordingly, the semiconductor package 1000 may have good reliability. In addition, the manufacturing process of the semiconductor package 1000 may be simplified and manufacturing costs thereof may be reduced, when compared to the manufacturing process of the semiconductor package according to a comparative example of separating the main region IMR and the edge region IER of the inter-wiring insulating layer IMD by using a separate trench and an insulating separation structure.

Figure 6:
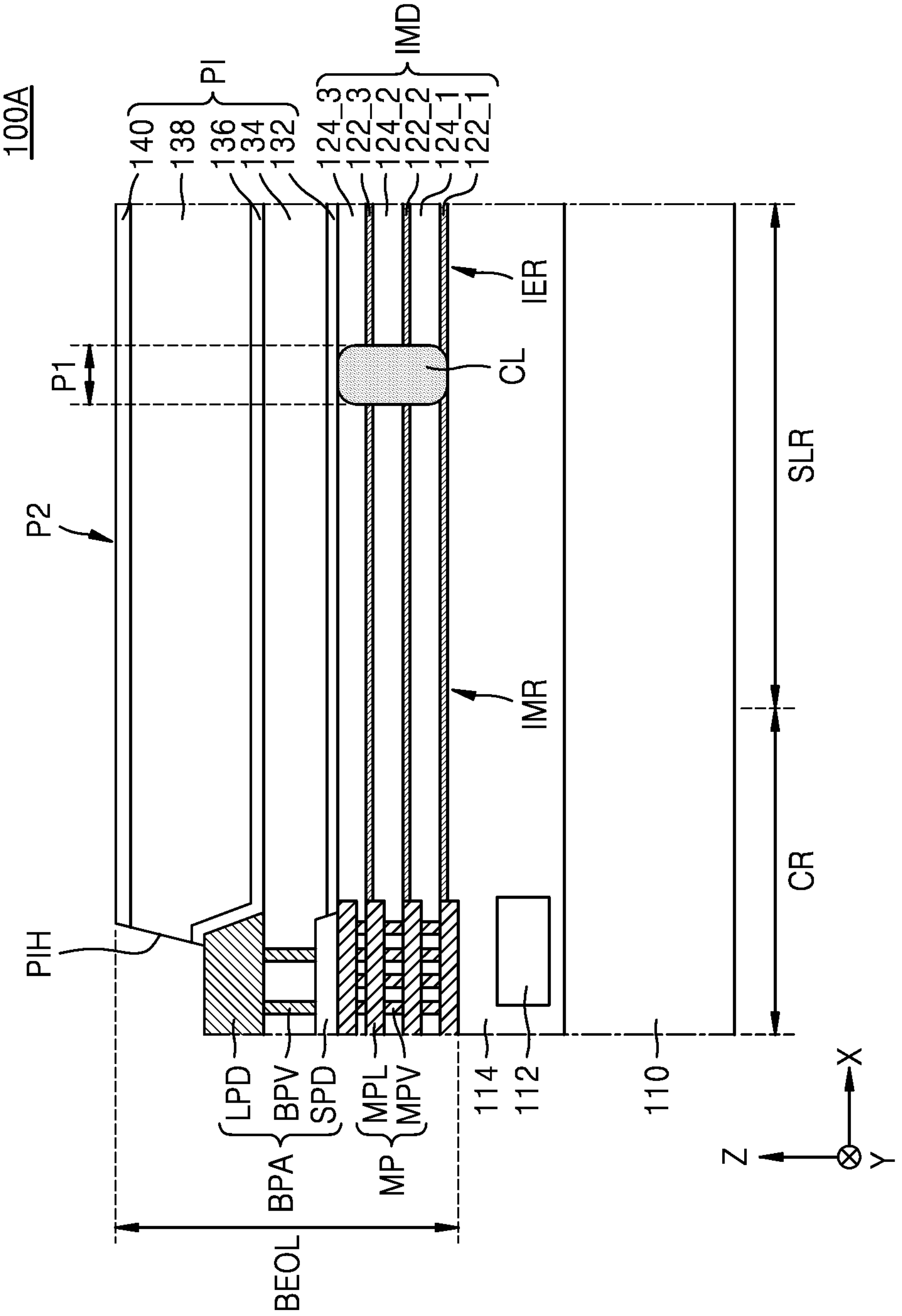
FIG. 6 is a cross-sectional view of an example of a semiconductor package.

FIG. 6 is a cross-sectional view of an example of a semiconductor package 1000A.

Referring to FIG. 6, a bonding pad structure BPA may include the sub-pad SPD arranged on the wiring structure MP, a pad via BPV connected to the sub-pad SPD, and the lower pad LPD electrically connected to the pad via BPV. In the bonding pad structure BPA described with reference to FIG. 5, an upper pad UPD may be omitted, compared to the bonding pad structure BP illustrated in FIG. 2.

The lower pad LPD of the bonding pad structure BPA may have an upper surface arranged at a lower level than the upper surface of the passivation layer PI, and the upper surface of the lower pad LPD may be exposed by an opening PIH of the passivation layer PI. A connection member, such as a microbump and a bump solder, may be further arranged in the opening PIH of the passivation layer PI. A connection member, such as a microbump or a bump solder, arranged in the opening PIH of the passivation layer PI may be used to attach a semiconductor chip to another semiconductor chip by using a thermal compression bonding method but is not limited thereto.

Figure 7:
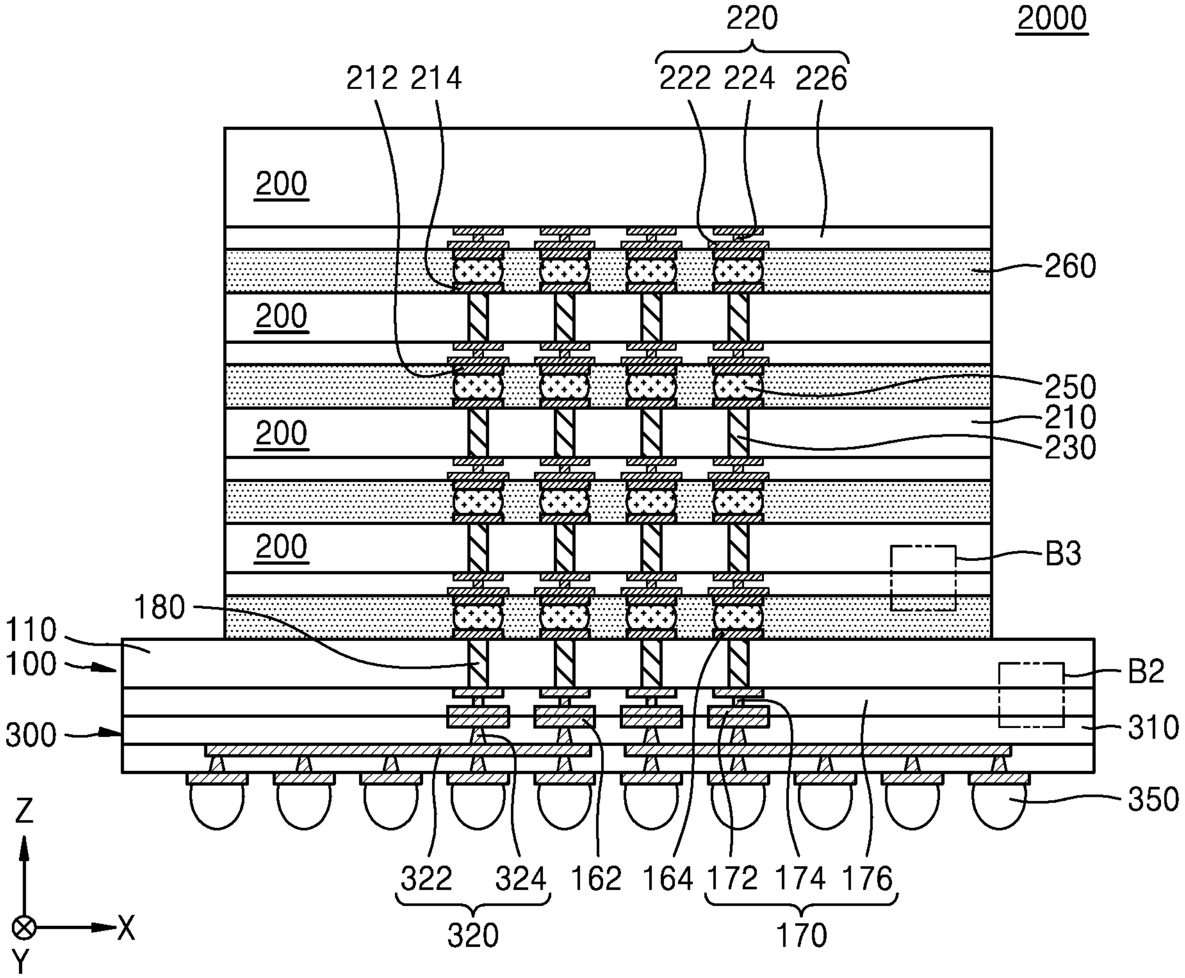
FIG. 7 is a cross-sectional view of another example of a semiconductor package.
Figure 8:
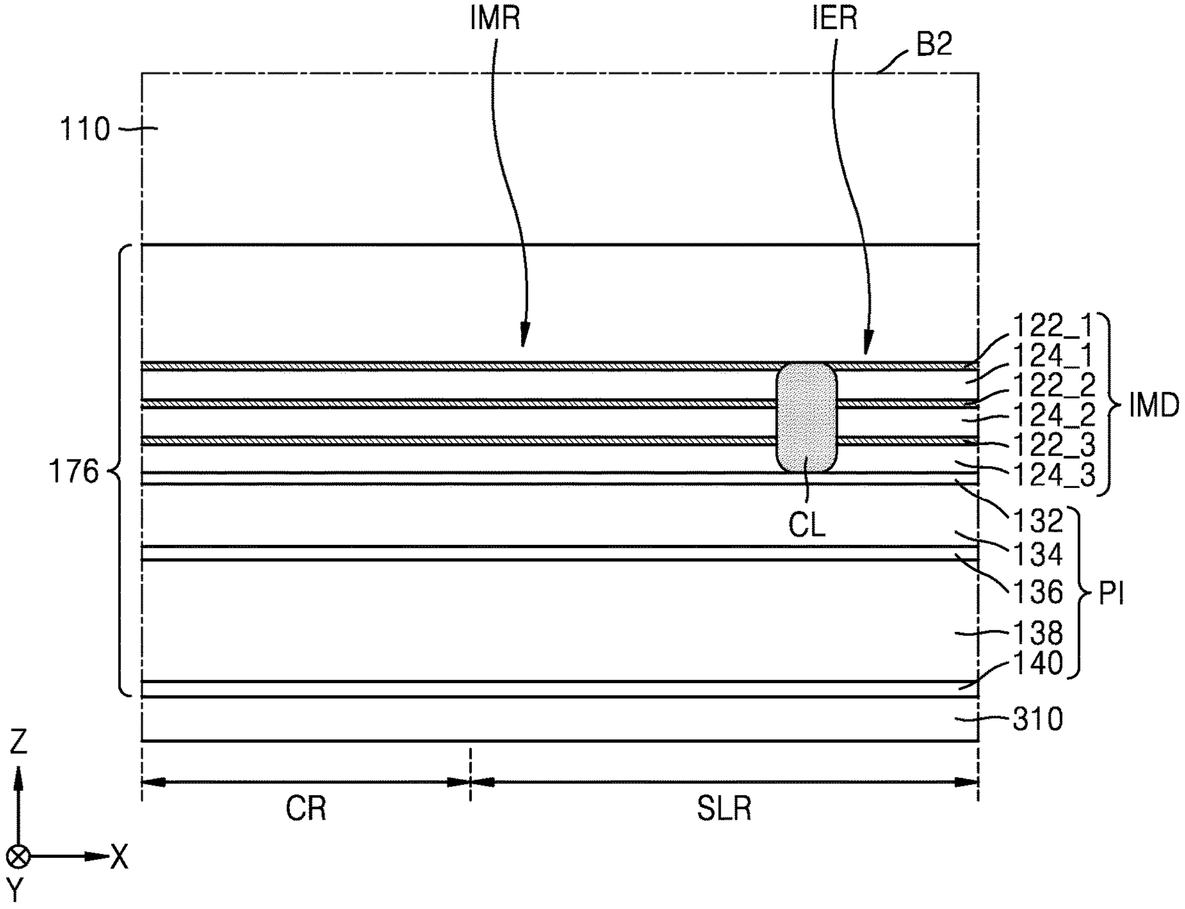
FIG. 8 is an example enlarged diagram of a region B2 in FIG. 7.
Figure 9:
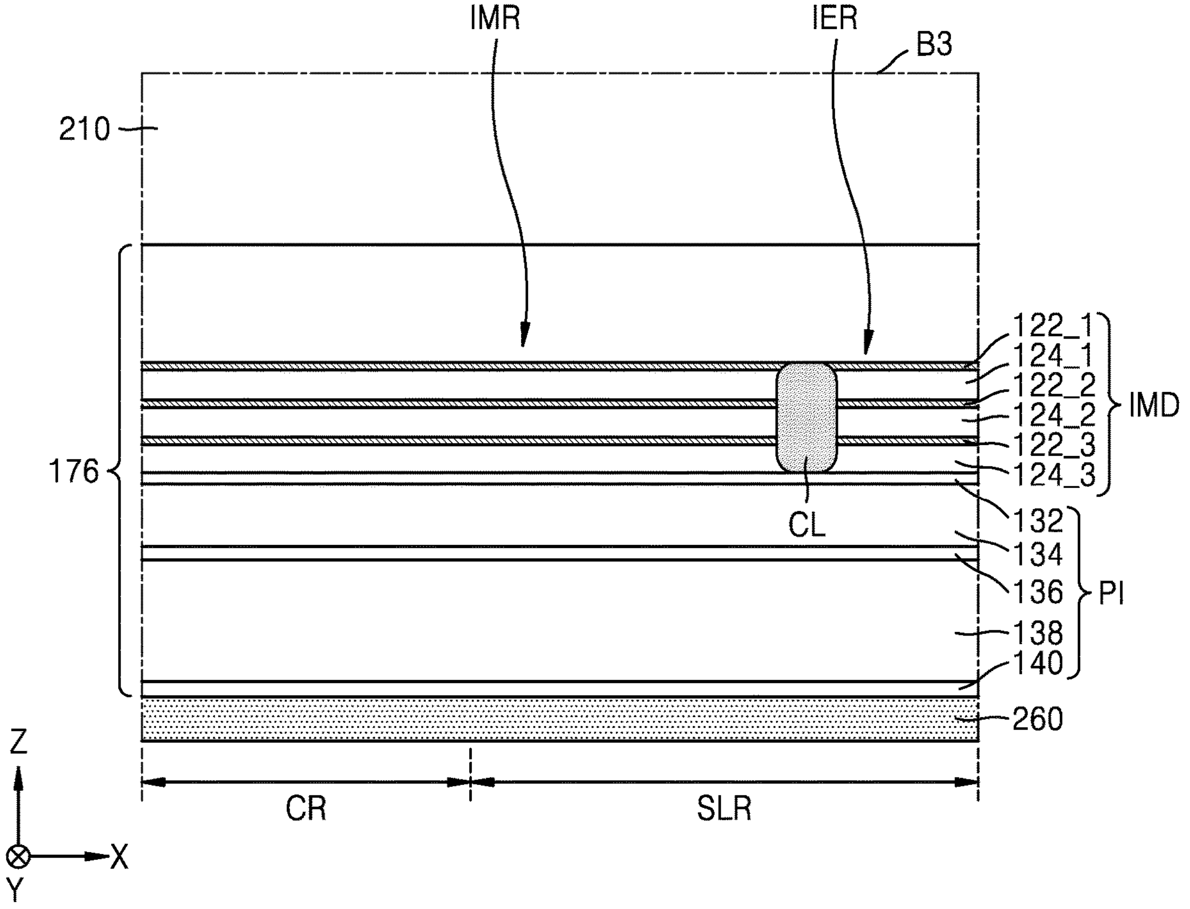
FIG. 9 is an example enlarged diagram of a region B3 in FIG. 7.

FIG. 7 is a cross-sectional view of another example of a semiconductor package 2000. FIG. 8 is an example enlarged diagram of a region B2 in FIG. 7. FIG. 9 is an example enlarged diagram of a region B3 in FIG. 7.

Referring to FIGS. 7 through 9, the semiconductor package 2000 may include an interposer 300, a first semiconductor chip 100 attached onto the interposer 300, and a plurality of second semiconductor chips 200 respectively stacked on the first semiconductor chip 100.

In FIG. 7, the semiconductor package 2000 is illustrated including one first semiconductor chip 100 and four second semiconductor chips 200, but the implementation is not limited thereto. For example, the semiconductor package 2000 may include two or more second semiconductor chips 200. In some implementations, the semiconductor package 2000 may include a multiple of four of second semiconductor chips 200. The plurality of second semiconductor chips 200 may be sequentially stacked on the first semiconductor chip 100 in the vertical direction Z. The first semiconductor chip 100 and each of the plurality of second semiconductor chips 200 may be sequentially stacked with an active surface thereof downward, that is, toward the interposer 300.

In some implementations, the interposer 300 may include a redistribution layer (RDL) interposer. The interposer 300 may include at least one of a redistribution insulating layer 310 and a plurality of redistribution patterns 320. The plurality of redistribution patterns 320 may respectively include a plurality of redistribution line patterns 322 and a plurality of redistribution vias 324. In some implementations, the interposer 300 may include a plurality of redistribution insulation layers 310, which are stacked on each other. The redistribution insulating layer 310 may be formed from, for example, photo imageable dielectric (PID) or photosensitive polyimide (PSPI). The plurality of redistribution patterns 320 respectively including the plurality of redistribution line patterns 322 and the plurality of redistribution vias 324 may include, for example, a metal, such as Cu, Al, W, Ti, Ta, indium (In), molybdenum (Mo), Mn, Co, Sn, nickel (Ni), magnesium (Mg), rhenium (Rc), beryllium (Be), gallium (Ga), and Ru, or an alloy thereof but are not limited thereto. In some implementations, the plurality of redistribution patterns 320 may be formed by stacking a metal or an alloy of a metal on a seed layer including Ti, titanium nitride, or titanium tungsten.

The plurality of redistribution line patterns 322 may be arranged on at least one of the upper surface and a lower surface of the redistribution insulating layer 310. The plurality of redistribution vias 324 may penetrate at least one redistribution insulating layer 310, and each of the plurality of redistribution vias 324 may be in contact with and connected to some of the plurality of redistribution line patterns 322. In some implementations, at least some of the plurality of redistribution line patterns 322 may be formed in one body together with some of the plurality of redistribution vias 324. For example, the redistribution line pattern 322 and the redistribution via 324 contacting an upper surface of the redistribution line pattern 322 may be formed in one body.

In some implementations, the plurality of redistribution vias 324 may have a tapered shape in which the horizontal width thereof narrows from a lower side to an upper side of the plurality of redistribution vias 324. In other words, the plurality of redistribution vias 324 may have a horizontal width increasing away from the first semiconductor chip 100.

Some of the plurality of redistribution line patterns 322 arranged on the upper surface of the interposer 300 may be referred to as redistribution upper surface pads, and some of the plurality of redistribution line patterns 322 arranged on the lower surface of the interposer 300 may be referred to as redistribution lower surface pads. A first front surface connection pad 162 may be connected to the redistribution upper surface pad, and a package connection terminal 350 may be attached to the redistribution lower surface pad. The package connection terminal 350 may function as an external connection terminal of the semiconductor package 2000. The package connection terminal 350 may connect the semiconductor package 2000 to the outside. In some implementations, the package connection terminal 350 may include a bump, a solder ball, etc.

In some other implementations, the interposer 300 may include a silicon interposer. When the interposer 300 includes a silicon interposer, the interposer 300 may further include a base layer including silicon and an internal through electrode penetrating the base layer, and may include an interposer lower surface pad arranged under the base layer and including the package connection terminal 350 attached thereto, instead of the redistribution lower surface pad.

The first semiconductor chip 100 may include the first substrate 110, a first wiring layer 170, and a plurality of first through electrodes 180. The plurality of first front surface connection pads 162 may be attached to the lower surface of the first semiconductor chip 100, and a plurality of first rear surface connection pads 164 may be attached to the upper surface of the first semiconductor chip 100. The second semiconductor chip 200 may include a second substrate 210, a second wiring layer 220, and a plurality of second through electrodes 230. A plurality of second front surface connection pads 212 may be attached to the lower surface of the second semiconductor chip 200, and a plurality of second rear surface connection pads 214 may be attached to the upper surface of the second semiconductor chip 200.

In the present disclosure, a front surface and a rear surface may respectively mean surfaces on an active surface side and an inactive surface side, and an upper surface and a lower surface may respectively mean surfaces on an upper side and a lower side in a drawing.

The first substrate 110 and the second substrate 210 may include an active surface and an inactive surface opposite to the active surface. The first substrate 110 and the second substrate 210 may include various types of plurality of individual devices on the active surface thereof. The first semiconductor chip 100 and the second semiconductor chip 200 may include a first semiconductor device and a second semiconductor device, which are constituted by the plurality of individual devices. The first semiconductor device may be arranged on the active surface of the first substrate 110, and the second semiconductor device may be arranged on the active surface of the second substrate 210.

The first semiconductor chip 100 and the plurality of second semiconductor chips 200 may include, for example, dynamic random-access memory (RAM) (DRAM), static RAM (SRAM), flash memory, electrically erasable and programmable RAM (EEPROM), phase-change RAM (PRAM), magnetic RAM (MRAM), or resistive RAM (RRAM).

In some implementations, the first semiconductor chip 100 may not include a memory cell. The first semiconductor device included in the first semiconductor chip 100 may include a serial-parallel conversion circuit, a test logic circuit, such as a design for test (DFT), a joint test action group (JTAG), and a memory built-in self-test (MBIST), and a signal interface circuit such as a physical layer (PHY). The second semiconductor device included in the plurality of second semiconductor chips 200 may include a memory chip. For example, the first semiconductor chip 100 may include a buffer chip for controlling the plurality of second semiconductor chips 200.

In some implementations, the first semiconductor chip 100 may include a buffer chip for controlling high bandwidth memory (HBM) DRAM, and the plurality of second semiconductor chips 200 may include a memory cell chip including a cell, which includes HBM DRAM controlled by the first semiconductor chip 100. The first semiconductor chip 100 may be referred to as a buffer chip or a master chip, and the second semiconductor chip 200 may be referred to as a memory cell chip or a slave chip. The first semiconductor chip 100 and a plurality of second semiconductor chips 200 stacked on the first semiconductor chip 100 may together be referred to as HBM DRAM devices or HBM DRAM chips.

The first wiring layer 170 may be arranged on the active surface of the first substrate 110. Each of the plurality of first front surface connection pads 162 and the plurality of first rear surface connection pads 164 may be arranged on the first wiring layer 170 and on the inactive surface of the first substrate 110. For example, the plurality of first rear surface connection pads 164 may be arranged on the upper surface of the first semiconductor chip 100, and the plurality of first front surface connection pads 162 may be arranged on the lower surface of the first semiconductor chip 100.

The first wiring layer 170 may include a plurality of first wiring patterns 172, a plurality of first wiring vias 174, and a first inter-wiring insulating layer 176. The plurality of first wiring vias 174 may be connected to an upper surface and/or a lower surface of the plurality of first wiring patterns 172. In some implementations, the plurality of first wiring patterns 172 may be arranged at different vertical levels, and the plurality of first wiring vias 174 may respectively connect between the plurality of first wiring patterns 172 arranged at different vertical levels. The plurality of first wiring patterns 172 and the plurality of first wiring vias 174 may respectively and electrically connect the plurality of first through electrodes 180 to the plurality of first rear surface connection pads 164. The first inter-wiring insulating layer 176 may surround the plurality of first wiring patterns 172 and the plurality of first wiring vias 174.

The plurality of first through electrodes 180 may vertically penetrate at least a portion of the first substrate 110 to respectively and electrically connect the plurality of first front surface connection pads 162 to the plurality of first rear surface connection pads 164. For example, the plurality of first front surface connection pads 162 may be respectively and electrically connected to the plurality of first rear surface connection pads 164 via the plurality of first through electrodes 180, the plurality of first wiring patterns 172, and the plurality of first wiring vias 174.

The second wiring layer 220 may be arranged on the active surface of the second substrate 210. Each of the plurality of second front surface connection pads 212 and the plurality of second rear surface connection pads 214 may be arranged on the second wiring layer 220 and on the inactive surface of the second substrate 210.

The second wiring layer 220 may include a plurality of second wiring patterns 222, a plurality of second wiring vias 224, and a second inter-wiring insulating layer 226. The plurality of second wiring vias 224 may be respectively connected to an upper surface and/or a lower surface of the plurality of second wiring patterns 222. In some implementations, the plurality of second wiring patterns 222 may be arranged at different vertical levels, and the plurality of second wiring vias 224 may respectively connect between the plurality of second wiring patterns 222 arranged at different vertical levels. The plurality of second wiring patterns 222 and the plurality of second wiring vias 224 may respectively and electrically connect the plurality of second through electrodes 230 to the plurality of second rear surface connection pads 214. The second inter-wiring insulating layer 226 may surround the plurality of second wiring patterns 222 and the plurality of second wiring vias 224.

The plurality of second through electrodes 230 may vertically penetrate at least portions of the second substrate 210 to respectively and electrically connect the plurality of second front connection pads 212 to the plurality of second rear surface connection pads 214. For example, the plurality of second front surface connection pads 212 may be respectively and electrically connected to the plurality of second rear surface connection pads 214 via the plurality of second through electrodes 230, the plurality of second wiring patterns 222, and the plurality of second wiring vias 224.

The plurality of first wiring patterns 172, the plurality of first wiring vias 174, the plurality of second wiring patterns 222, and the plurality of second wiring vias 224 may include a metal alloy, such as Cu, Al, W, Ti, Ta, Mo, cobalt (Co), Ni, or nitride thereof. The first inter-wiring insulating layer 176 and the second inter-wiring insulating layer 226 may include a high density plasma (HDP) oxide layer, a tetra-ethyl-ortho-silicate (TEOS) oxide layer, a tonen silazene (TOSZ) layer, a spin on glass (SOG) layer, an undoped silica glass (USG) layer, or a low-k dielectric layer.

As illustrated in FIG. 8, the first inter-wiring insulating layer 176 may include the inter-wiring insulating layer IMD sequentially arranged on the active surface of the first substrate 110, and the passivation layer PI arranged on the inter-wiring insulating layer IMD (as illustrated as arranged at a lower vertical level than the inter-wiring insulating layer IMD in FIG. 8). The main region IMR of the inter-wiring insulating layer IMD and the edge region IER of the inter-wiring insulating layer IMD may be separated from each other by the modified layer CL. Detailed descriptions of the inter-wiring insulating layer IMD, the passivation layer PI, and the modified layer CL may be referred to those given with reference to FIGS. 1 through 5.

As illustrated in FIG. 9, the second inter-wiring insulating layer 176 may include an inter-wiring insulating layer IMD sequentially arranged on the active surface of the second substrate 210, and the passivation layer PI arranged on the inter-wiring insulating layer IMD (as illustrated as arranged at a lower vertical level than the inter-wiring insulating layer IMD in FIG. 9). The main region IMR of the inter-wiring insulating layer IMD and the edge region IER of the inter-wiring insulating layer IMD may be separated from each other by the modified layer CL. Detailed descriptions of the inter-wiring insulating layer IMD, the passivation layer PI, and the modified layer CL may be referred to those given with reference to FIGS. 1 through 5.

Each of the plurality of first through electrodes 180 and the plurality of second through electrodes 230 may include a conductive plug and a conductive barrier layer surrounding the conductive plug. The conductive plug may include Cu or W. For example, the conductive plug may include Cu, CuSn, CuMg, CuNi, CuZn, CuPd, CuAu, CuRc, CuW, W, or a W alloy but is not limited thereto. For example, the conductive plug may include one or more of Al, Au, beryllium (Be), bismuth (Bi), Co, Cu, hafnium (Hf), In, Mn, Mo, Ni, lead (Pb), Pd, platinum (Pt), rhodium (Rh), Re, Ru, Ta, tellurium (Te), Ti, W, Zn, and zirconium (Zr), and may have one or more than two stacked structures. The conductive barrier layer may include at least one material of W, WN, WC, Ti, TiN, TaN, Ru, Co, Mn, WN, Ni, and NiB, and may have a single layer or a multiple layer.

A plurality of chip connection terminals 250 may be attached on the plurality of second front surface connection pads 212. Each of the plurality of chip connection terminals 250 may be arranged between the first rear surface connection pad 164 and the second front surface connection pad 212 facing each other, or between the second rear surface connection pad 214 and the second front surface connection pad 212 facing each other. The plurality of chip connection terminals 250 may respectively be arranged between the plurality of first rear surface connection pads 164 and the plurality of second front surface connection pads 212 attached to the lowermost second semiconductor chip 200 of the plurality of second semiconductor chips 200, and between the plurality of second front surface connection pads 212 attached to the remaining second semiconductor chips 200 of the plurality of second semiconductor chips 200 and the plurality of second rear surface connection pads 214 attached to the other second semiconductor chip 200 attached to the lower side of the plurality of second front surface connection pads 212, and may respectively and electrically connect the first semiconductor chip 100 to the plurality of second semiconductor chips 200.

The second front surface connection pad 212, to which the chip connection terminal 250 is attached, may be referred to as a front surface connection pad, the first rear surface connection pad 164 and the second rear surface connection pad 214, to which the chip connection terminal 250 is attached, may be referred to as rear surface connection pads, and the first front surface connection pad 162 may be referred to as an interposer connection pad.

In some implementations, of the plurality of second semiconductor chips 200, an uppermost second semiconductor chip arranged farthest from the first semiconductor chip 100 may not include the second rear surface connection pad 214 and the second through electrode 230. In some implementations, of the plurality of second semiconductor chips 200, the thickness of the second semiconductor chip at the uppermost end, arranged farthest from the first semiconductor chip 100, may be greater than the thickness of the remaining second semiconductor chips 200.

An insulating adhesive layer 260 may be attached to the inactive surface of the second substrate 210 except for the second semiconductor chip at the uppermost end of the plurality of second semiconductor chips 200 and the inactive surface of the first substrate 110, and each of the plurality of second semiconductor chips 200 may be attached to a lower structure, for example, to another second semiconductor chip 200 at the lower side of the plurality of second semiconductor chips 200. The insulating adhesive layer 260 may surround the chip connection terminal 250, and may fill between the first semiconductor chip 100 and each of the plurality of second semiconductor chips 200.

In some implementations, the insulating adhesive layer 260 may include a non-conductive film (NCF) including a heterogeneous material. The insulating adhesive layer 260 may be manufactured in the form of a laminateable film including a heterogeneous material, and may be attached to the upper surfaces of the first semiconductor chip 100 and the second semiconductor chip 200.

Figure 10:
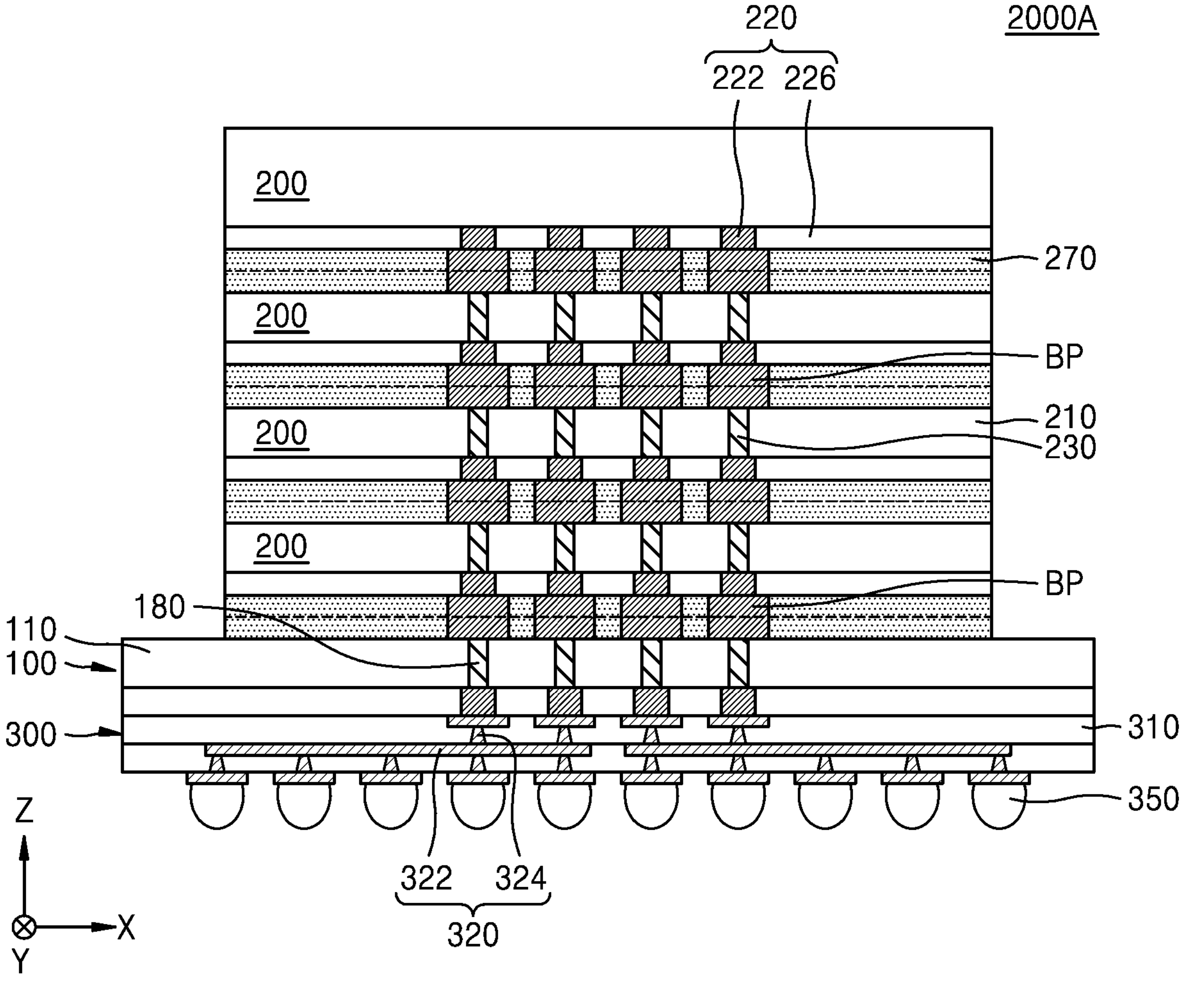
FIG. 10 is a cross-sectional view of another example of a semiconductor package.

FIG. 10 is a cross-sectional view of another example of a semiconductor package 2000A.

Referring to FIG. 10, the first semiconductor chip 100 and the plurality of second semiconductor chips 200 may be connected to each other by the bonding pad structure BP. For example, the bonding pad structure BP may be arranged between the first semiconductor chip 100 and the lowermost second semiconductor chip 200 and between two adjacent second semiconductor chips 200, and a passivation layer 270 may be arranged between the first semiconductor chip 100 and the lowermost second semiconductor chip 200 and between two adjacent second semiconductor chips 200 to surround the bonding pad structure BP. The bonding pad structure BP and the passivation layer 270 may attach the first semiconductor chip 100 to the plurality of second semiconductor chips 200 by using a hybrid copper bonding method. The bonding pad structure BP may have characteristics similar to those described for the bonding pad structure BP of the semiconductor package 1000 described with reference to FIGS. 1 through 5.

FIGS. 11 through 16 are schematic diagrams illustrating an example of a method of manufacturing a semiconductor package.

Figure 11:
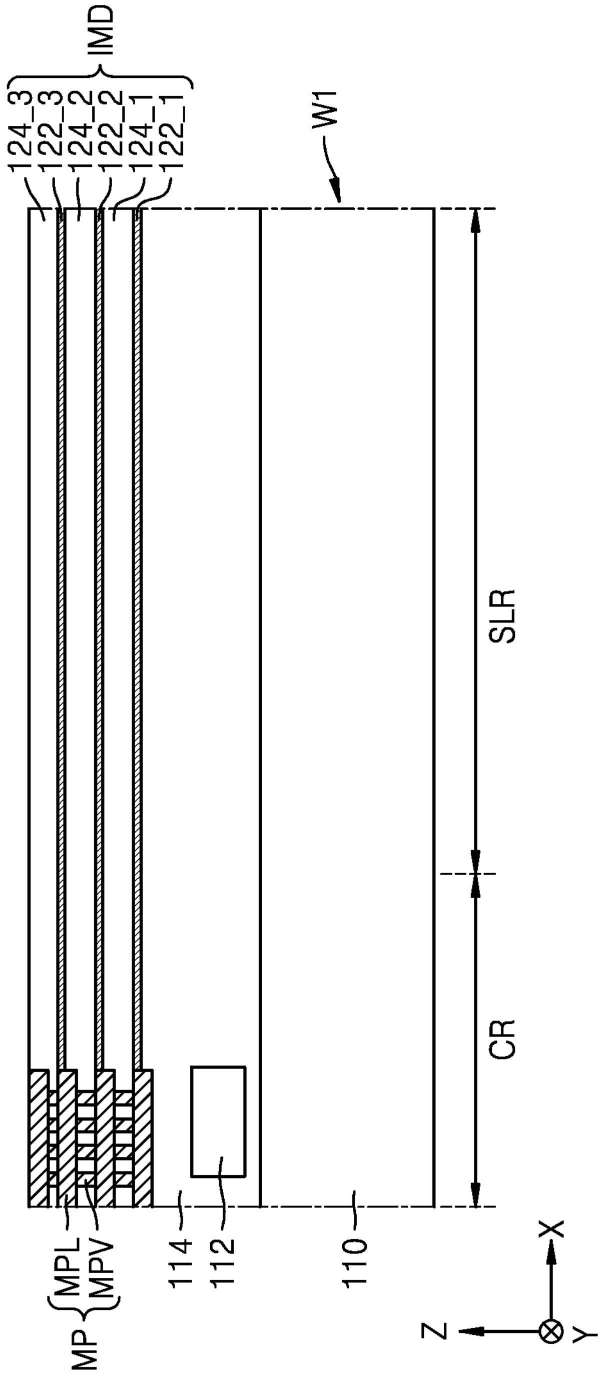
FIGS. 11 through 16 are schematic diagrams illustrating an example of a method of manufacturing a semiconductor package.

Referring to FIG. 11, a wafer W1 may be provided. The wafer W1 may include the substrate 110 including a plurality of chip regions (CRs) and the SLR. The plurality of CRs may be apart from each other by the SLR. The device layer 112 may be formed in the plurality of CRs, and the interlayer insulating layer 114 may be formed on the upper surface of the substrate 110 to cover the device layer 112.

The wiring structure MP may be arranged in the plurality of CRs, and a metal pattern, such as a test wiring structure and an overlay pattern, may be placed on the SLR. The inter-wiring insulating layer IMD covering the wiring structure MP and/or the metal pattern may be formed on the substrate 110.

In some implementations, the inter-wiring insulating layer IMD may be formed by sequentially forming, on the interlayer insulating layer 114, the first etch stop layer 122_1, the first low-k dielectric material layer 124_1, the second etch stop layer 122_2, the second low-k dielectric material layer 124_2, the third etch stop layer 122_3, and the third low-k dielectric material layer 124_3.

At least a portion of the inter-wiring insulating layer IMD may include a low-k dielectric material, that is, a material having a dielectric constant that is less than that of silicon oxide. For example, the first through third low-k dielectric material layers 124_1, 124_2, and 124_3 may include at least one of silicon carbon oxide (SiOC), silicon carbon nitride (SiCN), porous silicon carbide (SiC), and SiC hydroxide (SiCOH). The first through third etch stop layers 122_1, 122_2, and 122_3 may include at least one of SiOC, SiCN, SiC, and SiCOH and may respectively include materials having etching selectivities with respect to the first through third low-k dielectric material layers 124_1, 124_2, and 124_3.

Figure 12:
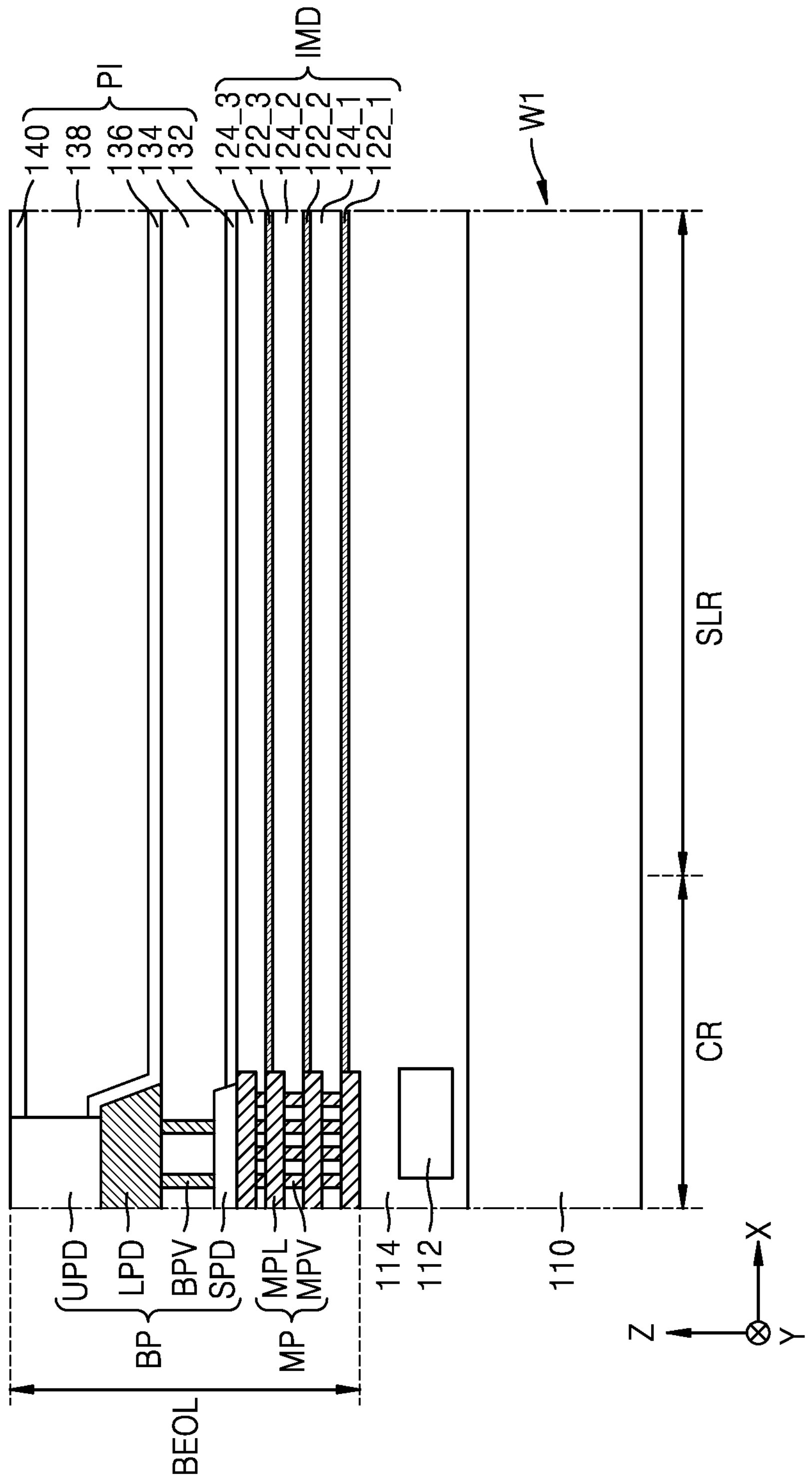

Referring to FIG. 12, the bonding pad structure BP electrically connected to the wiring structure MP on the inter-wiring insulating layer IMD and the wiring structure MP, and the passivation layer PI covering the bonding pad structure BP on the inter-wiring insulating layer IMD may be formed.

In some implementations, the bonding pad structure BP may include the sub-pad SPD arranged on the wiring structure MP, the pad via BPV connected to the sub-pad SPD, the lower pad LPD electrically connected to the pad via BPV, and the upper pad UPD arranged on the lower pad LPD.

In some implementations, the passivation layer PI may include the first insulating layer 132, the second insulating layer 134, the third insulating layer 136, the fourth insulating layer 138, and the cover insulating layer 140, which are sequentially stacked on the inter-wiring insulating layer IMD. In some implementations, the first insulating layer 132, the second insulating layer 134, the third insulating layer 136, the fourth insulating layer 138, and the cover insulating layer 140 may include at least one of silicon oxide, silicon oxynitride, and silicon nitride.

Figure 13:
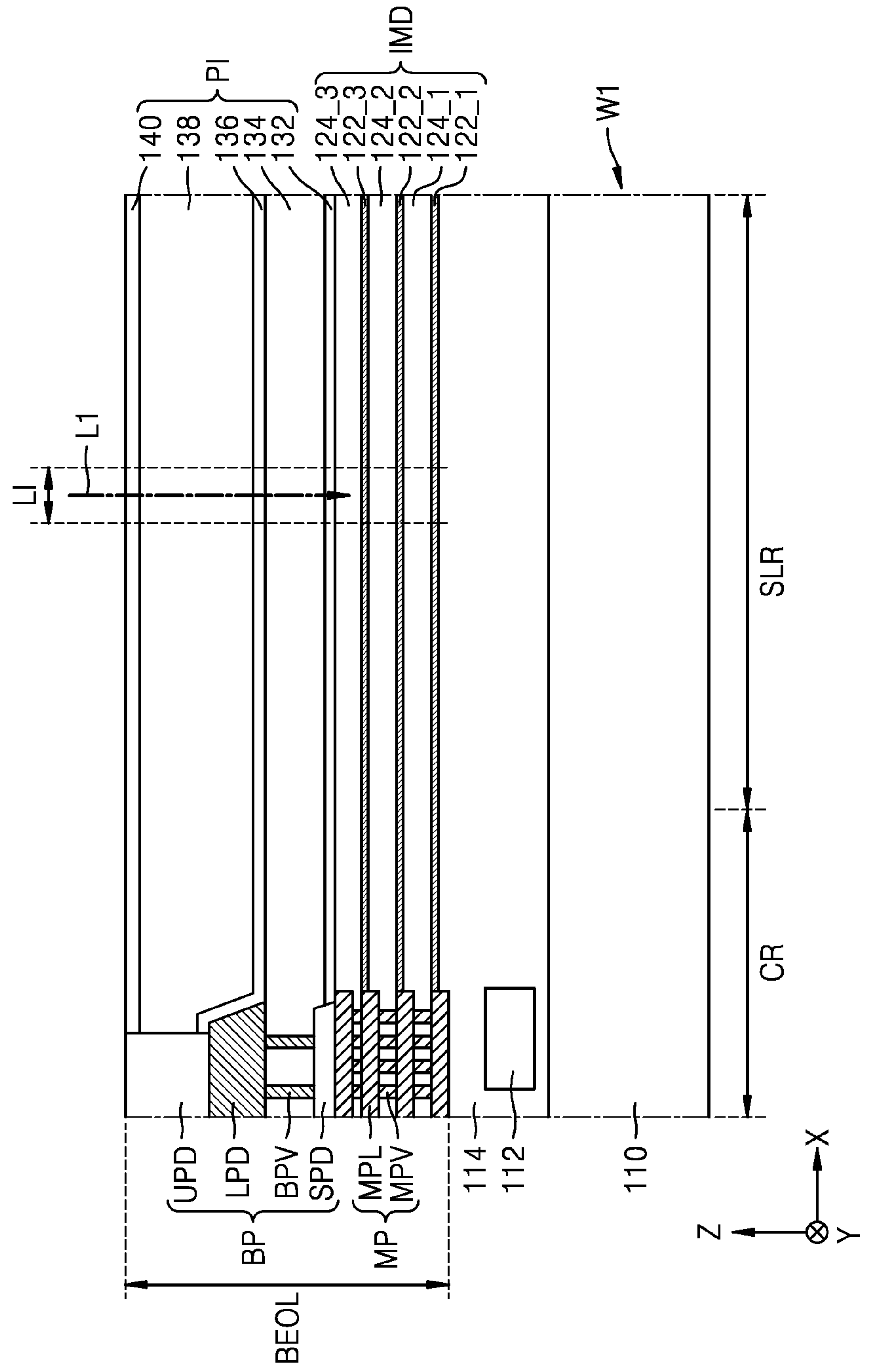

Referring to FIG. 13, laser light L1 may be irradiated onto an irradiation region LI of the passivation layer PI arranged in the SLR.

In some implementations, the laser light L1 may have a wavelength range of about 400 nm to 1080 nm. The laser light L1 may be irradiated on the passivation layer PI by using a laser irradiation device, which may irradiate the laser light L1 having a wavelength range of about 400 nm to 1080 nm, but the wavelength range of the laser light L1 is not limited thereto.

In some implementations, the laser light L1 may be configured to be focused on the inter-wiring insulating layer IMD arranged under the passivation layer PI by using a relatively large transmittance with respect to the irradiation region LI of the passivation layer PI. For example, the inter-wiring insulating layer IMD may have a first transmittance with respect to the laser light L1, and the passivation layer PI may have a second transmittance that is greater than the first transmittance with respect to the laser light L1. In some implementations, the second transmittance may be equal to or greater than 90%.

Figure 14:
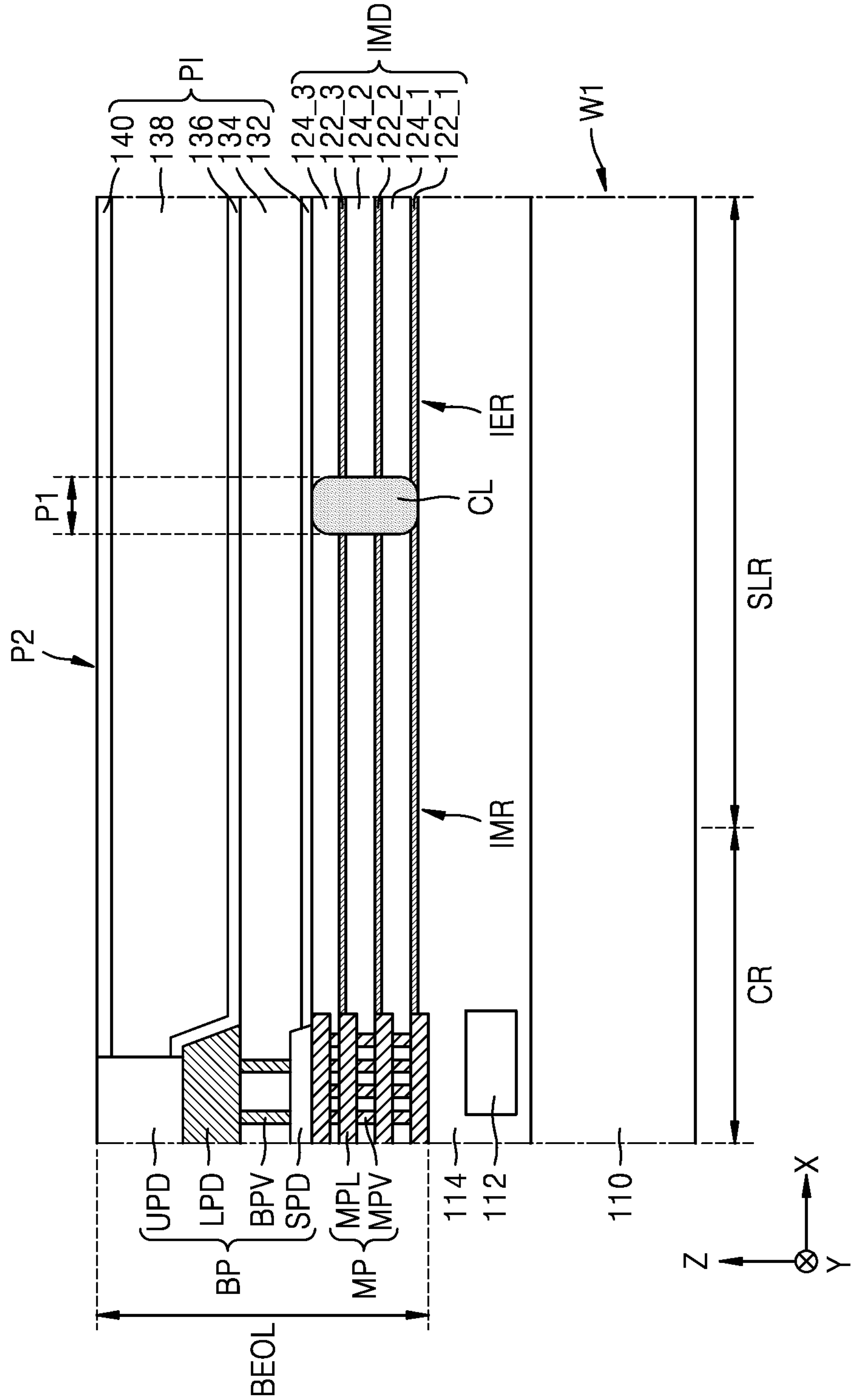

Referring to FIG. 14, as a result of irradiating the laser light L1 on the irradiation region LI of the passivation layer PI arranged in the SLR, a portion of the inter-wiring insulating layer IMD arranged under the irradiation region LI of the passivation layer PI may be converted into the modified layer CL.

In some implementations, the modified layer CL may be formed by carbonizing or phase-changing a portion of the inter-wiring insulating layer IMD by using the localized heat generated by the laser light L1. The modified layer CL may include a carbonized material formed by carbonizing a material constituting the inter-wiring insulating layer IMD, or steam or gas generated during carbonization of the material constituting the inter-wiring insulating layer IMD. As described with reference to FIGS. 3 through 5, the modified layer CL may have an irregular, rough, and unsmooth sidewall or may have a composition difference or color difference of a localized carbonized material inside the modified layer CL. The void CL_V (refer to FIG. 3) may be formed inside the modified layer CL by steam or gas generated during the carbonization process of the material constituting the inter-wiring insulating layer IMD.

As the passivation layer PI has a relatively high second transmittance with respect to laser light, even when a portion of the inter-wiring insulating layer IMD is converted into the modified layer CL as the laser light is irradiated on the first portion P1 of the passivation layer PI, there may be little or no physical change in the first portion P1 of the passivation layer PI irradiated by the laser light.

Alternatively, in some other implementations, as described with reference to FIG. 5, the volume of the modified layer CL may be locally reduced according to the degree of carbonization or the degree of formation of the void CL_V inside the modified layer CL, and the bottom surface of the first portion P1 of the passivation layer PI (for example, the bottom surface of a portion of the first insulating layer 132 corresponding to the first portion P1) may also be arranged at a somewhat lower level than the bottom surface of the second portion P2 (for example, the bottom surface of a portion of the first insulating layer 132 corresponding to the second portion P2).

In some implementations, the modified layer CL may be formed in a rectangular shape to surround the edge of the CR in a plan view, and as the modified layer CL is formed, the inter-wiring insulating layer IMD may be separated into the main region IMR and the edge region IER. The main region IMR may be arranged on the CR, the edge region IER may be arranged on the SLR, and the modified layer CL may be arranged between the main region IMR and the edge region IER to physically separate the main region IMR and the edge region IER apart from each other.

Figure 15:
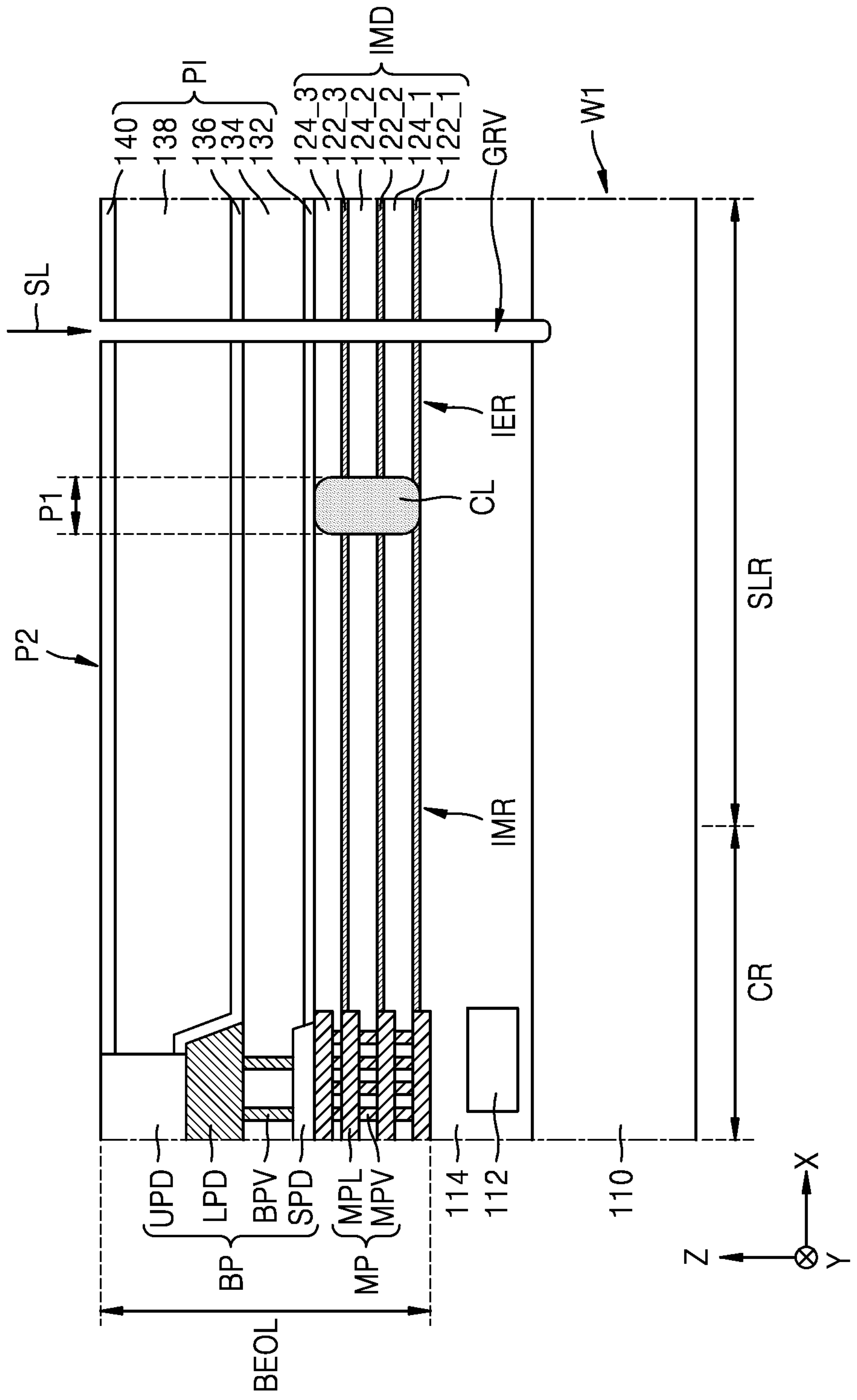

Referring to FIG. 15, a partial region of the passivation layer PI corresponding to a scribing line (SL), a partial region of the inter-wiring insulating layer IMD, and a partial region of the interlayer insulating layer 114 may be removed by using a laser grooving process to form a groove GRV in the SLR. The groove GRV may expose the edge region IER of the inter-wiring insulating layer IMD.

Figure 16:
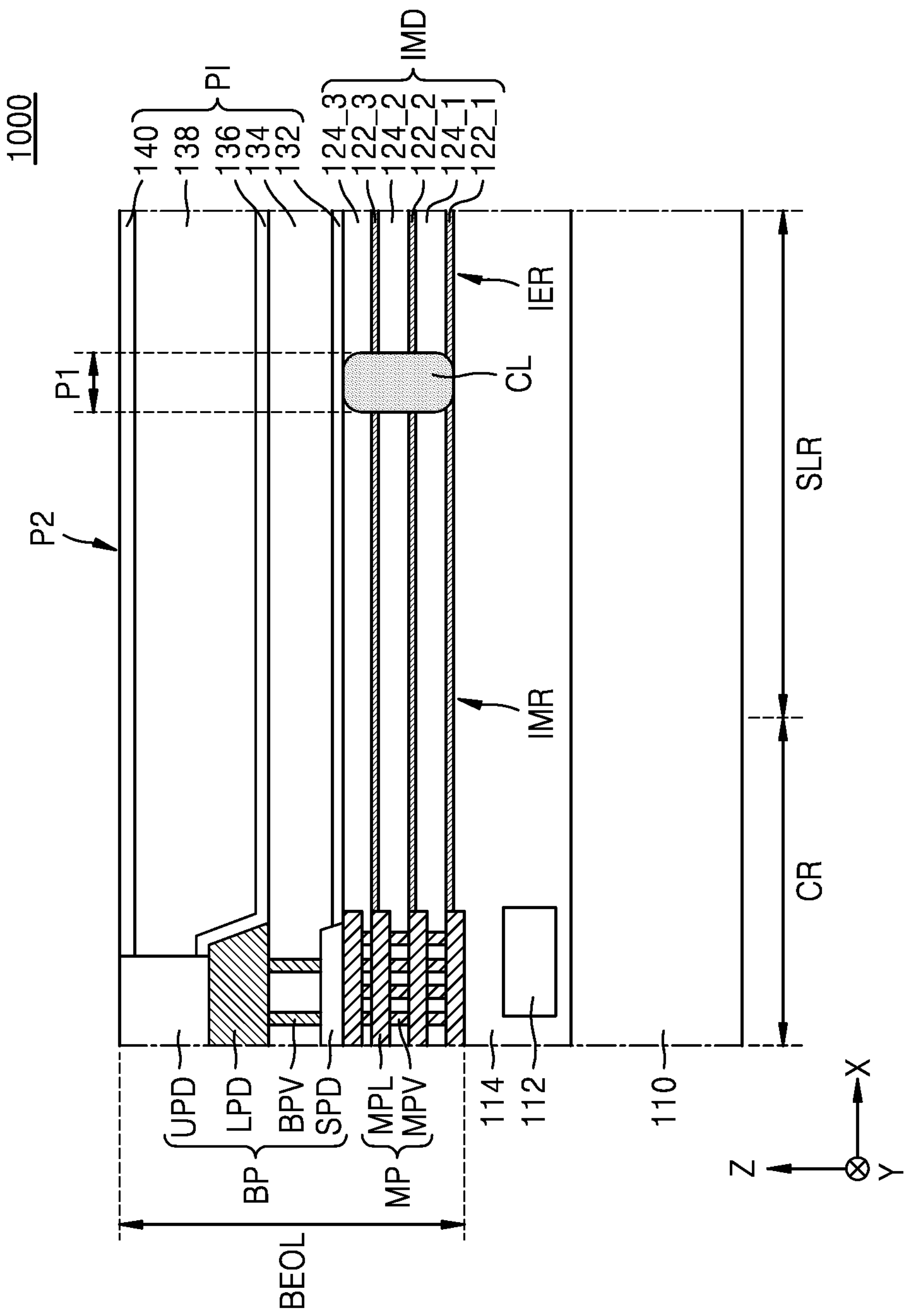

Referring to FIG. 16, the portion of the wafer W1 arranged on one side of the groove GRV in the SLR may be removed by using the sawing process, to be individualized into the semiconductor package 1000. The sawing process may be performed by using a blade or laser.

In some implementations described above, the modified layer CL may be formed by irradiating the laser light L1 on the passivation layer PI while the passivation layer PI is formed on the inter-wiring insulating layer IMD and carbonizing or phase-changing a portion of the inter-wiring insulating layer IMD into the modified layer CL. Thus, even when the edge region IER of the inter-wiring insulating layer IMD is exposed by laser sawing or blade sawing in the process of sawing the wafer W1 to be individualized into the semiconductor package 1000, the main region IMR of the inter-wiring insulating layer IMD may be prevented from being peeled, and the semiconductor package 1000 may have good reliability.

In addition, the manufacturing process of the semiconductor package 1000 may be simplified and manufacturing costs may be reduced, when compared to the manufacturing process of a semiconductor package according to a comparative example of separating the main region IMR from the edge region IER of the inter-wiring insulating layer IMD by using a separate trench and an insulating separation structure.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

While the concepts disclosed herein have been particularly shown and described with reference to implementations thereof, it will be understood that various changes in form and details may be made therein without departing from the spirit and scope of the following claims.

What is claimed is:

1. A semiconductor package comprising:

a substrate including an active surface and an inactive surface;

a plurality of wiring structures arranged on the active surface of the substrate;

an inter-wiring insulating layer arranged on the active surface of the substrate and covering the plurality of wiring structures;

a modified layer including a first side surface and a second side surface thereof covered by the inter-wiring insulating layer and including a carbonized material; and a passivation layer arranged on the inter-wiring insulating layer and the modified layer.

2. The semiconductor package of claim 1, wherein at least a portion of the inter-wiring insulating layer comprises a low-k dielectric material having a lower dielectric constant than silicon oxide, and at least a portion of the modified layer comprises the carbonized material constituting the inter-wiring insulating layer.

3. The semiconductor package of claim 1, wherein a boundary between the modified layer and the inter-wiring insulating layer has a rough shape.

4. The semiconductor package of claim 1, wherein, in a plan view, the modified layer has a rectangular shape extending along an edge of the substrate.

5. The semiconductor package of claim 1, wherein the passivation layer comprises a first portion on the modified layer and a second portion on the inter-wiring insulating layer, wherein the inter-wiring insulating layer has a first transmittance with respect to laser light, and wherein the first portion of the passivation layer has a second transmittance that is greater than the first transmittance with respect to the laser light.

6. The semiconductor package of claim 1, wherein the passivation layer comprises a first portion on the modified layer and a second portion on the inter-wiring insulating layer, and wherein a bottom surface of the first portion of the passivation layer is at a same level as a bottom surface of the second portion.

7. The semiconductor package of claim 1, wherein the substrate comprises a chip region and a scribe lane region surrounding the chip region in a plan view, and wherein the inter-wiring insulating layer comprises:

a first region arranged on the chip region and at least a portion of the scribe lane region of the substrate; and a second region arranged on the scribe lane region of the substrate, wherein the first region is physically separated from the second region by the modified layer therebetween.

8. The semiconductor package of claim 7, wherein the modified layer is arranged on the scribe lane region of the substrate, and wherein a boundary between the modified layer and the first region of the inter-wiring insulating layer faces a boundary between the modified layer and the second region of the inter-wiring insulating layer.

9. The semiconductor package of claim 1, wherein the inter-wiring insulating layer comprises a low-k dielectric material having a lower dielectric constant than silicon oxide, and wherein the passivation layer has a dielectric constant that is greater than the dielectric constant of the inter-wiring insulating layer.

10. The semiconductor package of claim 1, wherein the substrate further comprises a plurality of through electrodes extending from the active surface to the inactive surface of the substrate, and wherein the semiconductor package further comprises:

a plurality of front surface connection pads respectively and electrically connected to the plurality of wiring structures; and a plurality of rear surface connection pads arranged on the inactive surface of the substrate and respectively and electrically connected to the plurality of through electrodes.

11. A semiconductor package comprising:

a substrate including an active surface and an inactive surface;

a plurality of wiring structures arranged on the active surface of the substrate;

an inter-wiring insulating layer arranged on the active surface of the substrate and covering the plurality of wiring structures, the inter-wiring insulating layer comprising a main region and an edge region surrounding the main region in a plan view;

a modified layer arranged between the main region and the edge region of the inter-wiring insulating layer and comprising a carbonized form of a material constituting the inter-wiring insulating layer; and a passivation layer arranged on the inter-wiring insulating layer and the modified layer, wherein the passivation layer comprises a first portion on the modified layer and a second portion on the main region of the inter-wiring insulating layer, and a bottom surface of the first portion of the passivation layer is at a same level as a bottom surface of the second portion of the passivation layer.

12. The semiconductor package of claim 11, wherein the inter-wiring insulating layer comprises a low-k dielectric material having a lower dielectric constant than silicon oxide, and wherein the passivation layer has a dielectric constant that is greater than a dielectric constant of the inter-wiring insulating layer.

13. The semiconductor package of claim 11, wherein a boundary between the modified layer and the main region of the inter-wiring insulating layer faces a boundary between the modified layer and the edge region of the inter-wiring insulating layer.

14. The semiconductor package of claim 11, wherein a boundary between the modified layer and the inter-wiring insulating layer has a rough shape.

15. The semiconductor package of claim 11, wherein, in a plan view, the modified layer has a rectangular shape extending along an edge of the substrate.

16. The semiconductor package of claim 11, wherein the inter-wiring insulating layer has a first transmittance with respect to laser light, and wherein the first portion of the passivation layer has a second transmittance that is greater than the first transmittance with respect to the laser light.

17. The semiconductor package of claim 11, wherein the substrate further comprises a plurality of through electrodes extending from the active surface to the inactive surface of the substrate, and wherein the semiconductor package further comprises:

a plurality of front surface connection pads respectively and electrically connected to the plurality of wiring structures; and a plurality of rear surface connection pads arranged on the inactive surface of the substrate and respectively and electrically connected to the plurality of through electrodes.

18. A semiconductor package comprising:

a buffer die including a first semiconductor substrate, the first semiconductor substrate comprising:

a first active surface and a first inactive surface, wherein the first active surface is opposite to the first inactive surface; and a plurality of first through electrodes penetrating the first semiconductor substrate, wherein a first inter-wiring insulating layer is on the first active surface of the first semiconductor substrate, a first front surface insulating layer is on the first inter-wiring insulating layer, and a first rear surface insulating layer is on the first inactive surface of the first semiconductor substrate;

a plurality of memory dies stacked on the buffer die, each memory die including a second semiconductor substrate, the second semiconductor substrate comprising:

a second active surface and a second inactive surface, wherein the second active surface is opposite to the second inactive surface; and a plurality of second through electrodes penetrating the second semiconductor substrate, wherein a second inter-wiring insulating layer is on the second active surface, wherein a second front surface insulating layer is on the second inter-wiring insulating layer, wherein a second rear surface insulating layer is on the second inactive surface, and wherein the second active surface of each memory die is arranged toward the first inactive surface of the buffer die;

a plurality of first bonding pads arranged between a lowermost memory die of the plurality of memory dies and the buffer die, and surrounded by the second front surface insulating layer of the lowermost memory die and the first rear surface insulating layer; and a plurality of second bonding pads arranged between two adjacent memory dies of the plurality of memory dies, and surrounded by the second front surface insulating layer and the second rear surface insulating layer arranged between two adjacent memory dies of the plurality of memory dies, wherein the first inter-wiring insulating layer comprises a first region arranged on a chip region of the buffer die and a second region arranged on a scribe lane region of the buffer die, and the first region is apart from the second region by a modified layer arranged between the first region and the second region.

19. The semiconductor package of claim 18, wherein the second inter-wiring insulating layer comprises a first region arranged on a chip region of the memory die and a second region arranged on a scribe lane region of the memory die, and the first region of the second inter-wiring insulating layer is separated from the second region of the second inter-wiring insulating layer by a second modified layer arranged therebetween.

20. The semiconductor package of claim 18, wherein at least a portion of the first inter-wiring insulating layer comprises a low-k dielectric material having a lower dielectric constant than silicon oxide, and at least a portion of the modified layer comprises a carbonized form of a material constituting the first inter-wiring insulating layer.

* * * * *